(12) United States Patent
Otremba et al.

(10) Patent No.: US 8,975,735 B2
(45) Date of Patent: Mar. 10, 2015

(54) REDISTRIBUTION BOARD, ELECTRONIC COMPONENT AND MODULE

(71) Applicant: Infineon Technologies AG, Neubiberg (DE)

(72) Inventors: Ralf Otremba, Kaufbeuren (DE); Josef Höglauer, Heimstetten (DE)

(73) Assignee: Infineon Technologies AG, Neubiberg (DE)

( * ) Notice: Subject to any disclaimer, the term of this patent is extended or adjusted under 35 U.S.C. 154(b) by 30 days.

(21) Appl. No.: 13/962,622

(22) Filed: Aug. 8, 2013

(65) Prior Publication Data
US 2015/0041859 A1    Feb. 12, 2015

(51) Int. Cl.
| | |
|---|---|
| H01L 23/02 | (2006.01) |
| H01L 23/34 | (2006.01) |
| H01L 23/06 | (2006.01) |
| H01L 21/00 | (2006.01) |
| H05K 7/00 | (2006.01) |
| H01L 23/522 | (2006.01) |
| H01L 29/778 | (2006.01) |

(52) U.S. Cl.
CPC .......... *H01L 23/5226* (2013.01); *H01L 29/778* (2013.01)
USPC ...... 257/678; 257/724; 257/684; 257/E23.01; 257/E23.151; 438/107; 361/777; 361/780

(58) Field of Classification Search
USPC ......... 257/724, 690, 723, 718, 719, 692, 678, 257/684, 687, E25.029, E25.03, E23.052, 257/E23.036, E23.003, E23.01, E23.011, 257/E23.015, E23.016, E23.02, E23.151, 257/E21.524, E27.013; 438/107; 361/777, 361/780
See application file for complete search history.

(56) References Cited

U.S. PATENT DOCUMENTS

| | | | |
|---|---|---|---|
| 6,743,049 B2 * | 6/2004 | Perugini et al. .......... 439/607.05 |
| 6,770,969 B2 * | 8/2004 | Mosley .......................... 257/724 |
| 7,193,308 B2 * | 3/2007 | Matsui .......................... 257/686 |
| 7,973,405 B2 * | 7/2011 | Takahashi et al. ............. 257/724 |
| 8,049,311 B2 * | 11/2011 | Lim et al. ...................... 257/659 |
| 8,183,696 B2 * | 5/2012 | Meyer et al. ................... 257/774 |
| 8,350,382 B2 * | 1/2013 | Furgut et al. .................. 257/724 |
| 8,519,524 B1 * | 8/2013 | Wu et al. ....................... 257/686 |
| 8,816,497 B2 * | 8/2014 | Wu ................................ 257/728 |
| 2004/0053444 A1 * | 3/2004 | Yoneda et al. ................. 438/106 |
| 2005/0233503 A1 * | 10/2005 | Leib et al. ..................... 438/127 |
| 2007/0252270 A1 * | 11/2007 | Takano et al. ................. 257/723 |
| 2008/0023841 A1 * | 1/2008 | Nakasato et al. .............. 257/773 |
| 2008/0272497 A1 * | 11/2008 | Lake ............................. 257/774 |
| 2014/0036464 A1 * | 2/2014 | Kilger ........................... 361/767 |

* cited by examiner

*Primary Examiner* — Evan Pert
*Assistant Examiner* — Gustavo Ramallo
(74) *Attorney, Agent, or Firm* — Murphy, Bilak & Homiller, PLLC (57) ABSTRACT

A redistribution board includes a first conductive layer including a redistribution structure for low voltage signals, a second conductive layer including a redistribution structure for high voltage signals, and a non-conductive layer. The second conductive layer is spaced apart from the first conductive layer by the non-conductive layer. The redistribution board further includes a conductive connector extending from a mounting surface of the redistribution board to the second conductive layer. The conductive connector is surrounded by a low voltage trace of the first conductive layer.

20 Claims, 10 Drawing Sheets

REDISTRIBUTION BOARD, ELECTRONIC COMPONENT AND MODULE

BACKGROUND

A semiconductor chip may be provided in the form of an electronic component including a package with outer contacts which are used to mount the electronic component on a redistribution board, such as a printed circuit board. The package may include an epoxy resin which embeds the semiconductor chip, protecting it from the environment, and which covers the internal electrical connections from the semiconductor chip to inner portions of the outer contacts. The outer contacts of the package may have different forms, for example, pins, lands or solder balls.

SUMMARY

In an embodiment, a redistribution board includes a first conductive layer including a redistribution structure for low voltage signals, a second conductive layer including a redistribution structure for high voltage signals, a non-conductive layer, the second conductive layer being spaced apart from the first conductive layer by the non-conductive layer and a conductive connector extending from a mounting surface of the redistribution board to the second conductive layer, the connector being surrounded by a low voltage trace of the first conductive layer.

In an embodiment, an electronic component includes at least one high voltage driven semiconductor device and a footprint, the footprint including a high voltage contact and a low voltage contact pad surrounding, and spaced apart from, the high voltage contact.

In an embodiment, a module includes a redistribution board and an electronic component. The redistribution board includes a first conductive layer including a redistribution structure for low voltage signals, a second conductive layer including a redistribution structure for high voltage signals, a non-conductive layer, the second conductive layer being spaced apart from the first conductive layer by the non-conductive layer and a conductive connector extending from a mounting surface of the redistribution board to the second conductive layer, the connector being surrounded by a low voltage trace of the first conductive layer. The electronic component includes at least one high voltage driven semiconductor device and a footprint. The footprint includes a high voltage contact electrically coupled to the second conductive layer and a low voltage contact pad surrounding, and spaced apart from, the high voltage contact and electrically coupled to the low voltage trace.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 10b illustrates a footprint of the electronic component of FIG. 10a.
FIG. 11b illustrates a footprint of the electronic component of FIG. 11a.
FIG. 14b illustrates a footprint of an electronic component of the module FIG. 14a.
FIG. 15b illustrates a footprint of an electronic component of the module of FIG. 15a.

DETAILED DESCRIPTION

In the following detailed description, reference is made to the accompanying drawings, which form a part hereof, an in which is shown by way of illustration specific embodiments in which the invention may be practiced. In this regard, directional terminology, such as "top", "bottom", "front", "back", "leading", "trailing", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the Figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As used herein, the term "conductive" denotes electrically conductive and the term "non-conductive" denotes non-electrically conductive.

As used herein, the term "low voltage signal" describes a signal having a maximum voltage of 20 V and includes ground signals and the term "high voltage signal" describes a signal having a voltage of greater than 200 V, for example 600 V.

Figure 1:
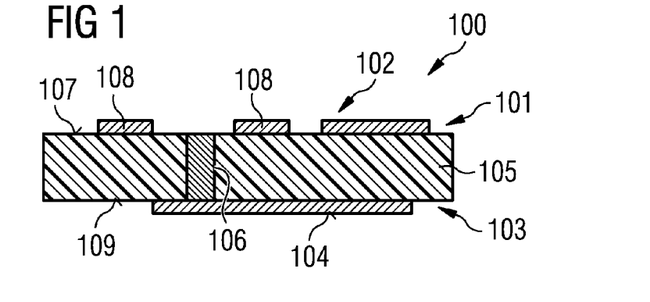
FIG. 1 illustrates a cross-sectional view of a redistribution board.

FIG. 1 illustrates a redistribution board 100 according to an embodiment. The redistribution board 100 includes a first conductive layer 101 including a redistribution structure 102 for low voltage signals. The redistribution board 100 further includes a second conductive layer 103 including a redistribution structure 104 for high voltage signals. The redistribution board 100 includes a non-conductive layer 105. The second conductive layer 103 is spaced apart from the first conductive layer 101 by the non-conductive layer 105. The redistribution board 100 further includes a conductive connector 106 extending from a mounting surface 107 of the redistribution board 100 to the second conductive layer 103. The conductive connector 106 is surrounded by a low voltage trace 108 of the first conductive layer 101.

The redistribution board 100 may be provided by a printed circuit board and includes two redistribution structures, a first redistribution structure 102 for low voltage signals and a second redistribution structure 104 for high voltage signals. The second redistribution structure 104 for high voltage signals is spaced apart from the first redistribution structure 102 for low voltage signals by the non-conductive layer 105. The conductive connector 106 extends from the mounting surface 107 of the redistribution board 100 on which, in this embodiment, the first conductive layer 101 is positioned. The conductive connector 106 serves to provide a connection from a high voltage contact on a component mounted on the mounting surface 107 to the opposing surface 109 of the non-conductive layer 105 on which the redistribution structure 104 for the high voltage signals is positioned.

The conductive connector 106 may be a conductive via which is fabricated in the redistribution board 100. The conductive connector 106 may form part of an electronic component which is mounted on the redistribution board.

The non-conductive layer 105 may include a dielectric material such as FR4 which includes glass fibres embedded in an epoxy resin. The first conductive layer 101, the second conductive layer 103 and the conductive connector 106 may be metallic and may include a metal such as copper. The first conductive layer 101, the second conductive layer 103 and the conductive connector 106 may have a multilayer metallic structure.

The low voltage trace 108 forms part of the redistribution structure 102 for low voltage signals and may be positioned on the mounting surface 107. The low voltage trace 108 surrounds the conductive connector 106 and, in particular, a surface of the conductive connector 106 which is exposed from the non-conductive layer 105 at the mounting surface 107. The low voltage trace 108 may be positioned adjacent more than 50% or more than 75% of the outer contour of the mounting surface 107. The low voltage trace 108 is conductive and may be used to provide electrical shielding for the conductive connector 106 which is coupled to the redistribution structure 104 for high voltage signals.

The redistribution structure 102 for low voltage signals is spaced at a distance from the redistribution structure 104 for high voltage signals due to the thickness of the non-conductive layer 105. This arrangement may be used to increase the creepage distance between the redistribution structure 102 for low voltage signals and the redistribution structure 104 for high voltage signals.

As used herein, the creepage distance is defined as the shortest path between two conductive materials measured along the surface of an isolator which is positioned between the two conductive materials. In the case of the embodiment illustrated in FIG. 1, the isolator is provided by the portion of the non-conductive layer 105 positioned between the surface of the conductive connector 106 exposed at the mounting surface 107 and the low voltage conductive trace 108.

Maintaining a minimum creepage distance may assist in reducing the risk of failure over time. The generation of a conductive path along the isolator surface due to the high voltage applied over long periods of time, i.e. creepage, is related to the RMS value and also may depend on environmental conditions which may be described by a degree of pollution and the materials characteristics of the isolator.

By positioning the redistribution structure 102 for low voltage signals and the redistribution structure 104 for high voltage signals on opposing surfaces of the non-conductive layer 105, the creepage distance may be increased over an arrangement in which both redistribution structures 102, 104 are arranged on a single surface without having to increase the lateral size of the single surface.

Figure 2:
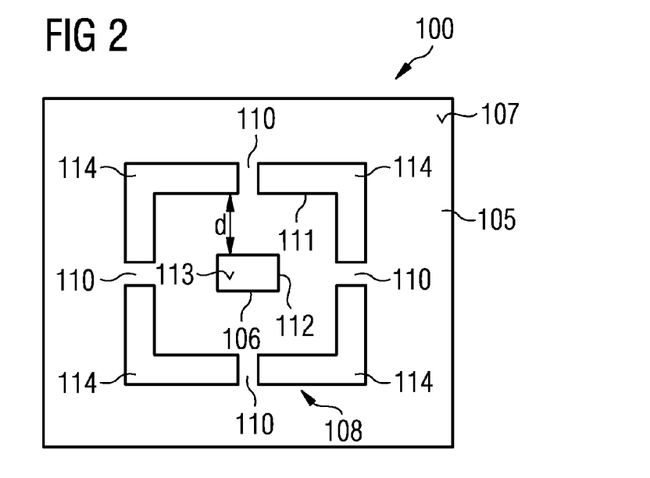
FIG. 2 illustrates a plan view of a redistribution board.
Figure 3:
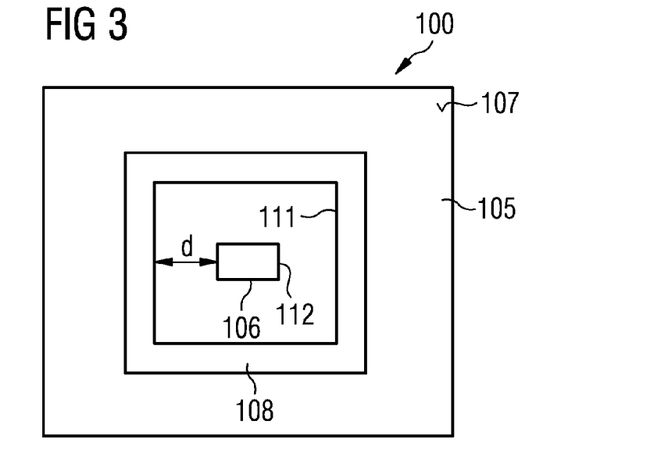
FIG. 3 illustrates a plan view of redistribution board.

FIGS. 2 and 3 illustrate top views of a portion of the redistribution board 100 of FIG. 1 according to different embodiments, and illustrate the mounting surface 107 and the lateral arrangement of the low voltage trace 108 of the first conductive layer 102 and the conductive connector 106.

The low voltage trace 108 is positioned on the mounting surface 107 and laterally surrounds the exposed distal end surface 113 of the conductive connector 106. The low voltage trace 108 may have the form of a continuous ring, as is illustrated in FIG. 3, or may be non-continuous as is illustrated in FIG. 2. In some embodiments, the low voltage trace 108 includes four L-shaped portions 114 separated by regions 110 of the non-conductive layer 105. The four L-shaped portions 114 are positioned around the corners of the square distal end surface 113 of the conductive connector 106.

In the drawings, the exemplary low voltage trace 108 is represented as a square ring with sharp corners and the exemplary distal end surface 113 of the conductive connector 106 is represented as a square or rectangle with sharp corners. However, the low voltage trace 108 and the distal end surface 113 of the conductive connector 106 are not limited to this outer contour and may have outer contours in which the corners are rounded, the distal end surface 113 is circular, oval, hexagonal etc. and in which the low voltage trace 108 is a circular ring, an ovular ring, a hexagonal ring or has an irregular outer contour and an inner contour which is coaxial with the outer contour of the distal end surface 113.

The low voltage trace 108 may lie at ground potential and may provide electrical shielding for the conductive connector 106. In some embodiments, the low voltage conductive trace 108 has an inner boundary 111 which is spaced at a minimum distance d from an outer boundary 112 of the distal end surface 113 of the conductive connector 106. The distance d is the shortest path between the inner boundary 111 of the low voltage conductive trace 108 and the outer boundary 112 of the distal end surface 113 of the conductive connector 106 and represents the creepage distance.

Figure 4:
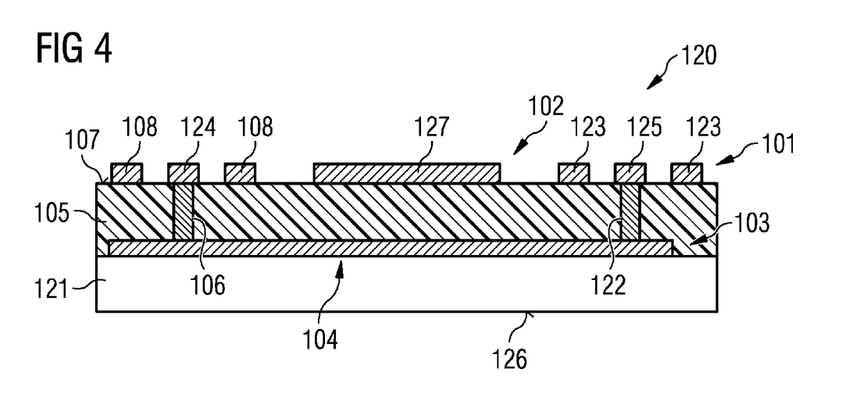
FIG. 4 illustrates a cross-sectional view of a redistribution board.
Figure 5:
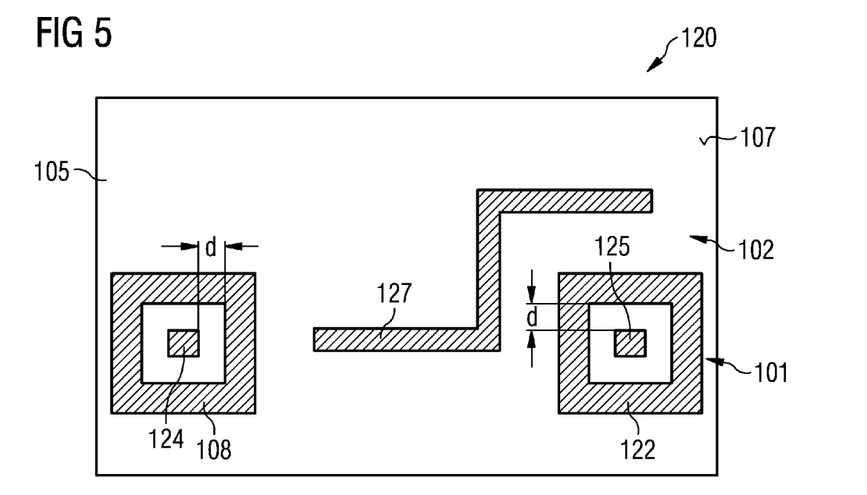
FIG. 5 illustrates a plan view of a redistribution board.

FIG. 4 illustrates a cross-sectional view and FIG. 5 a plan view of a redistribution board 120 according to an embodiment. The redistribution board 120 includes a first conductive layer 101 including a first redistribution structure 102 for low voltage signals, and a second conductive layer 103 including a second redistribution structure 104 for high voltage signals separated from the first conductive layer 101 by a first non-conductive layer 105. The redistribution board 120 also includes a conductive connector 106 in the form of a conductive via extending through the first non-conductive layer 105. The redistribution board 120 further includes a second non-conductive layer 121 which is positioned on the second conductive layer 103. The second conductive layer 103 including the redistribution structure 104 for high voltage signals is positioned between the first non-conductive layer 105 and the second non-conductive layer 121.

The redistribution board 120 further includes a second electrically conductive via 122 which extends from the mounting surface 107 to the second conductive layer 103 through the first non-conductive layer 105. The first conductive layer 101 further includes a second low voltage trace 123 which surrounds the second conductive via 122. The first low voltage trace 108 and the second low voltage trace 123 are positioned on the mounting surface 107 of the redistribution board 120.

The second electrically conductive via 122 may also extend from the second conductive layer 103 through the second non-conductive layer 121 to the lower surface 126 of the redistribution board 120.

FIG. 5 illustrates a plan view of the redistribution board 120. As can be seen in the plan view of FIG. 5, the second low voltage conductive trace 123 surrounds, and is spaced at a distance from, the conductive via 122 which is out of view in FIG. 5. The first non-conductive layer 105 provides electrical insulation of the low voltage conductive trace 123 from the conductive via 122 which is coupled to the second redistribution structure 104 for high voltage signals.

The first low voltage trace 108 and the second low voltage trace 123 may have the same form, for example, a continuous ring as is illustrated in FIG. 5, or may have differing forms. For example, one of the low voltage traces may be a discontinuous trace. For example, one or both of low voltage traces 108, 123 may include four portions having the arrangement illustrated in FIG. 2.

The first low voltage trace 108 and the second low voltage trace 123 may have an outer contour in which the corners are rounded, or have the form of a circular ring, an ovular ring, a hexagonal ring or has an irregular outer contour and an inner contour which is coaxial with the outer contour of the distal end surface.

The second electrically conductive via 122 may be used to connect the second redistribution structure 104 for high voltage signals to a connector so that the redistribution board 120 and the second redistribution structure 104 including the two electrically conductive vias 106, 122 may be supplied with a high voltage.

The redistribution board 120 may include a further contact pad 124 positioned directly on the first electrically conductive via 106 and a second contact pad 125 positioned directly on the conductive via 122 which form part of the second redistribution structure 104 for high voltage signals but are arranged on the mounting surface 107 along with the first redistribution structure 102.

The low voltage traces 108 and 123 are spaced at a predefined minimum distance d from the respective contact pads 124, 125. In particular, the distance d extends between the outer boundary of the contact pads 124, 125 and the inner boundary of the conductive trace 108, 123, respectively. The material of the first non-conductive layer 105 electrically isolates the contact pads 124, 125 from the low voltage traces 108, 123. The shortest distance between the contact pad 124 and the first low voltage trace 108 represents the creepage distance of this arrangement. Similarly, the shortest distance between the contact pad 125 and the second low voltage trace 123 represents the creepage distance of this arrangement.

The contact pads 124, 125 may be fabricated by structuring portions of the first conductive layer 101. The first redistribution structure 102 includes further traces 127 for low voltage signals, for example a ground signal or for control signals of further low voltage devices which are to be mounted on the redistribution board 120.

The arrangement of the second redistribution structure 104 for high voltage signals, the first redistribution structure 102 for low voltage signals, the conductive vias 106, 122 and contact pads 124, 125 may be used for applications including at least one high voltage driven semiconductor device. An example of such a high voltage driven semiconductor device is a gallium nitride-based transistor such as a gallium nitride-based HEMT which may be driven by a voltage of up to 600 V.

The redistribution board 120 is not limited to having one or two electrically conductive connectors and may include more than two electrically conductive connectors electrically coupled to the second redistribution structure 104 for high voltage signals.

An electronic component is also provided which is suitable for mounting on the redistribution board illustrated in FIGS. 1 to 5.

Figure 6:
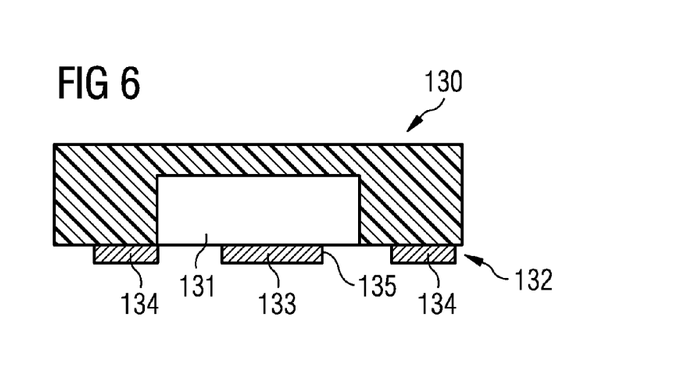
FIG. 6 illustrates an electronic component.

FIG. 6 illustrates an electronic component 130 including a high voltage driven semiconductor device 131 and a footprint 132. The footprint 132 includes a high voltage contact 133 and a low voltage contact pad 134 surrounding, and spaced apart from, the high voltage contact 133.

The footprint of an electronic component may describe the lateral extent and the arrangement of the outer contacts of the electronic component on the mounting surface of the electronic component. If, for example, the electronic component is a surface mountable device, the footprint of the electronic component may include a lateral area and an arrangement of a plurality of outer contacts having a predefined lateral arrangement.

In the embodiment illustrated in FIG. 6, the electronic component 130 includes a high voltage contact 133 and a low voltage contact pad 134 which is spaced at a distance from an outer boundary 135 of the high voltage contact 133 such that the low voltage contact pad 134 surrounds the high voltage contact 133 and may be electrically insulated from high voltage contact 133 by regions of a non-conductive housing positioned between the low voltage contact pad 134 and the high voltage contact 133.

The low voltage contact pad 134 may have a continuous ring form or maybe discontinuous. The low voltage contact pad 134 may be electrically insulated from the high voltage contact 133. The electronic component 130 may also include a control contact pad (not shown) which is spaced at a distance from an outer boundary of the low voltage contact pad 134 and/or a plurality of signal pads spaced at a distance from an outer boundary of the low voltage contact pad 134.

In some embodiments, the electronic component 130 may include at least one further high voltage contact (not shown). The high voltage contact 133 and the at least one further high voltage contact may be surrounded by the low voltage contact pad 134. In embodiments in which the electronic component 130 includes a signal pad (not shown), the signal pad may be spaced at a distance d1 on at least three sides from the low voltage contact pad 134 and the high voltage contact 133 may be spaced at a distance d2 on all sides from the low voltage contact pad 134.

The electronic component 130 may further include a housing (not shown), for example an epoxy resin. The low voltage contact pad 134 may be provided by lands and the high voltage contact 133 may be provided by a pin protruding from housing. In this embodiment, the electronic component 130 includes two different types of outer contact. In some embodiments, the low voltage contact pad 134 and the high voltage contact 133 are provided by lands.

The high voltage driven semiconductor device may be a Group III-nitride transistor such as a Group III-nitride HEMT device. The term "Group III-nitride" refers to a material device or structure comprising a compound semiconductor material according to the stoichiometric formula $Al_xIn_yGa_zN$, where $x+y+z=1$.

In embodiments in which the high voltage driven semiconductor device is a transistor, the transistor may have a drain electrode, a source electrode and a gate electrode. The drain electrode is electrically coupled to the high voltage contact and the source electrode is electrically coupled to the low voltage contact pad. The gate electrode may be electrically coupled to a further gate contact pad.

Figure 7A:
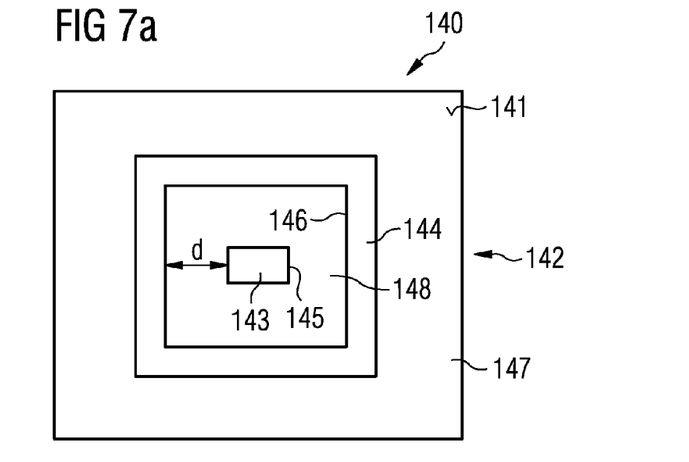
FIG. 7a illustrates a footprint of an electronic component.
Figure 7B:
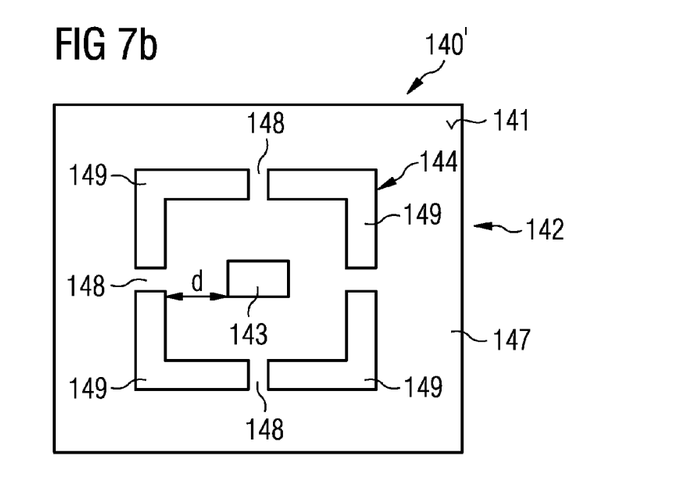
FIG. 7b illustrates a footprint of an electronic component.

FIG. 7a and FIG. 7b each illustrate a respective plan view of an electronic component 140, 140' including a non-illustrated high voltage driven semiconductor device and, in particular, the lower surface 141 and footprint 142 of the electronic component 140. In the electronic component 140 illustrated in FIG. 7a, the electronic component 140 includes a high voltage contact pad 143 positioned in the centre of the lower surface 141 of the electronic component 140 which is surrounded by a low voltage contact pad 144 in the form of a continuous square ring which is spaced at a distance from an outer boundary 145 of the high voltage contact 143. The low voltage contact pad 144 includes an inner boundary 146 which is spaced the from the outer boundary 145 of the high voltage contact 143 and electrically insulated from the high voltage contact 143 by a region 148 of housing 147 of the electronic component 140.

In the embodiment illustrated in FIG. 7b, the low voltage contact pad 144 of the electronic component 140' is discontinuous and includes four portions 149 separated from one another by regions 148 of the housing 147 of the electronic component 140. The low voltage contact pad 144 includes four L-shaped portions 149 positioned at a minimum distance d from the high voltage contact 143. Each L-shaped portion extends around a corner of the square high voltage contact 143.

The lateral arrangement of the low voltage contact pad 144 and the high voltage contact 143 of the electronic components 140, 140' corresponds to the lateral arrangement of the conductive trace 108 and electrically conductive connector 106 of the redistribution boards 100 illustrated in FIGS. 2 and 3. The electronic components 140, 140' may be mounted on the corresponding arrangement of the redistribution board 100.

Figure 8:
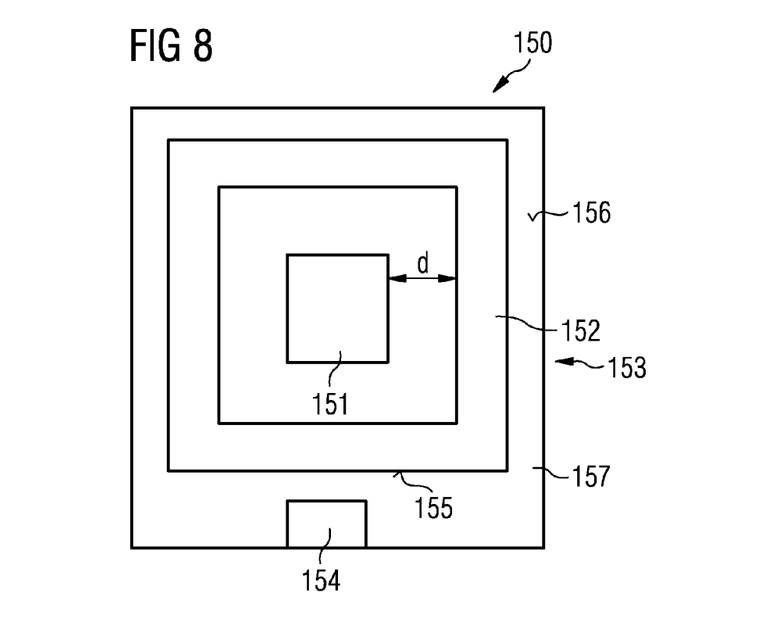
FIG. 8 illustrates a footprint of an electronic component.

FIG. 8 illustrates an electronic component 150 including a high voltage driven semiconductor device in the form of a transistor (out of view), in particular, a Group III nitride HEMT. The electronic component 150 includes a high voltage contact 151 surrounded by a low voltage contact 152 spaced at a minimum distance d from the high voltage contact 151. The high voltage contact 151 and the low voltage contact 152 are positioned at a mounting surface 156 of the electronic component 150 and are embedded in non-conductive epoxy resin 157 forming a housing of the electronic component 150. The low voltage contact pad 152 has a continuous ring form and is generally square. The high voltage contact 152 is positioned in the centre of the mounting surface 156. The footprint 153 further includes a gate contact pad 154 which is spaced at a distance from an outer boundary 155 of the low voltage contact pad 152 on one side of the square ring shape of the low voltage contact pad 152. The epoxy resin 157 of the housing extends between the gate contact pad 154 and the low voltage contact pad 152 and between the low voltage contact pad 152 and the high voltage contact 152.

The transistor includes a drain electrode, which is electrically coupled to the high voltage contact 151, a source electrode, which is electrically coupled to the low voltage contact pad 152, and a gate electrode, which is electrically coupled to the gate contact pad 154.

Figure 9:
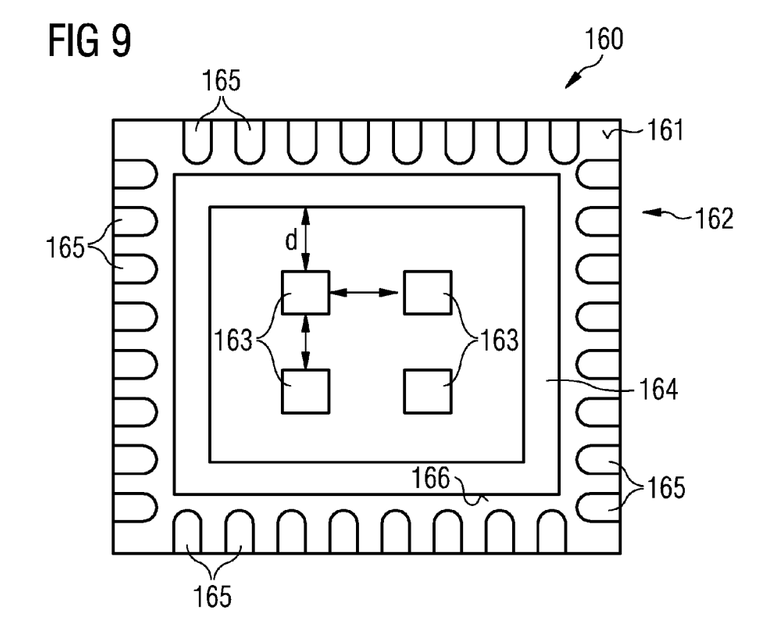
FIG. 9 illustrates a footprint of an electronic component.

FIG. 9 illustrates an electronic component 160 and, in particular, a plan view of a lower surface 161 of the electronic component 160 including a footprint 162. The electronic component 160 includes four high voltage contacts 163 which are arranged in a regular grid in the centre of the footprint 162 and a single low voltage contact pad 164 in the form of a square ring which surrounds the four high voltage contacts 163.

The low voltage contact pad 164 provides a ground pad for the electronic component 160. The low voltage contact pad 164 is spaced at a minimum distance d from the outer boundaries of the high voltage contacts 163. The distance d represents the creepage distance between the high voltage contacts 163 and the low voltage contact pad 164. The electronic component 160 further includes a plurality of signal contact pads 165 which are arranged at intervals on all four sides of the peripheral region of the lower surface 164 and are spaced at a distance from an outside boundary 166 of the low voltage contact pad 164.

Figure 10A:
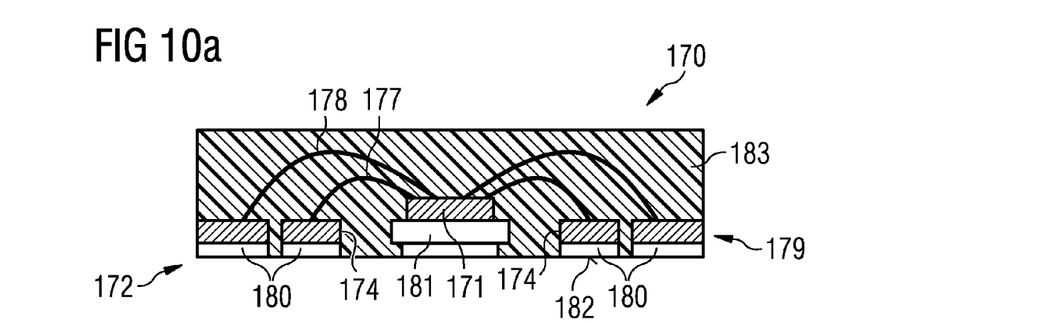
FIG. 10a illustrates a cross-sectional view of an electronic component.
Figure 10B:
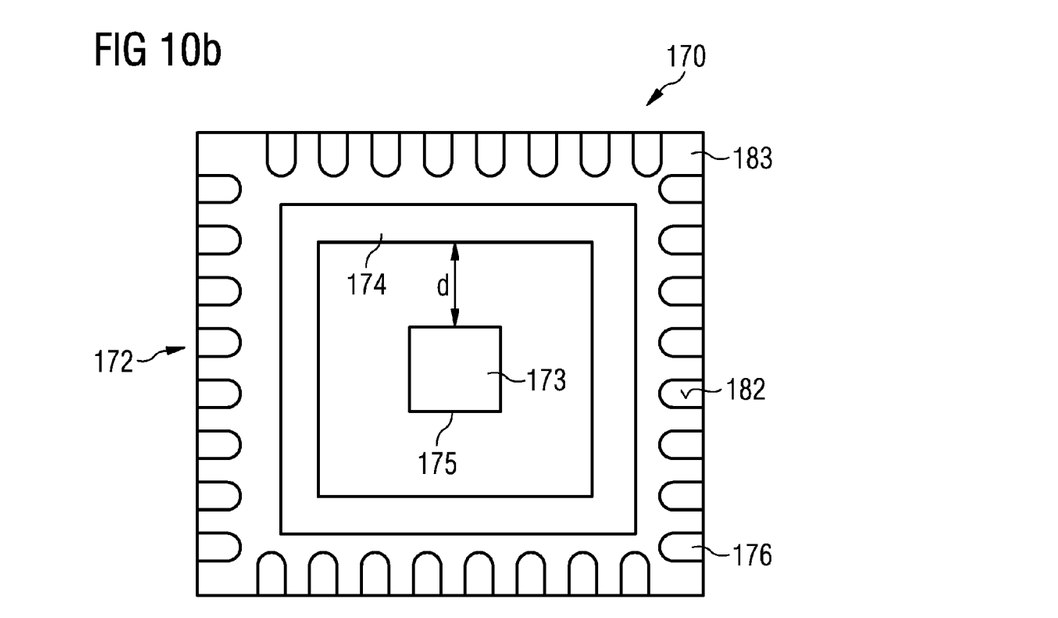

FIG. 10a illustrates a cross-sectional view and FIG. 10b a plan view of an electronic component 170 according to an embodiment. The electronic component 170 includes a semiconductor device 171 and a footprint 172 including surface mountable contact pads in the form of lands arranged in a common plane. The footprint 172 includes a single high voltage contact pad 173 and a continuous ring shaped low voltage contact pad 174 which is spaced at a distance d from an outer boundary 175 of the high voltage contact 173. The low voltage contact pad 174 is coaxial with the square high voltage contact pad 173. The electronic component 170 further includes a plurality of signal contact pads 176 which are arranged at intervals in the peripheral region of the footprint 172 on all four sides of the component.

As is illustrated in the cross-sectional view of FIG. 10a, the electronic component 170 includes a leadframe 179 with portions 180 surrounding a die pad 181 on which the semiconductor device 171 is mounted. The lower surface 182 of the leadframe 179 provides the high voltage contact pad 173, the low voltage contact pad 174 and the signal contact pads 176.

The semiconductor device 171 is electrically connected to the low voltage contact pad 174 by a first plurality of bond wires 177 and to the plurality of signal contact pads 176 by a second plurality of bond wires 178. The semiconductor device 171 is mounted on a portion of a leadframe 179 providing a die pad 181 and is electrically connected to this portion of the leadframe 179. The electronic component 170 includes a plastic housing which encapsulated the semiconductor device 171, the first plurality of bond wires 177, the second plurality of bond wires 178, and the upper portions of the leadframe 179.

The lower surface 182 of the die pad 181 of the leadframe 179 is exposed from the housing 183 and forms the high voltage contact 173 exposed at the lower surface 180 of the electronic component 170. The further contact pads 174, 176 are also provided by exposed portions 180 of the leadframe 179. The lower surface 182 of the leadframe 179 may include a solderable coating. For example, the leadframe 179 may include copper and the solderable coating may include a nickel phosphorus alloy.

Figure 11A:
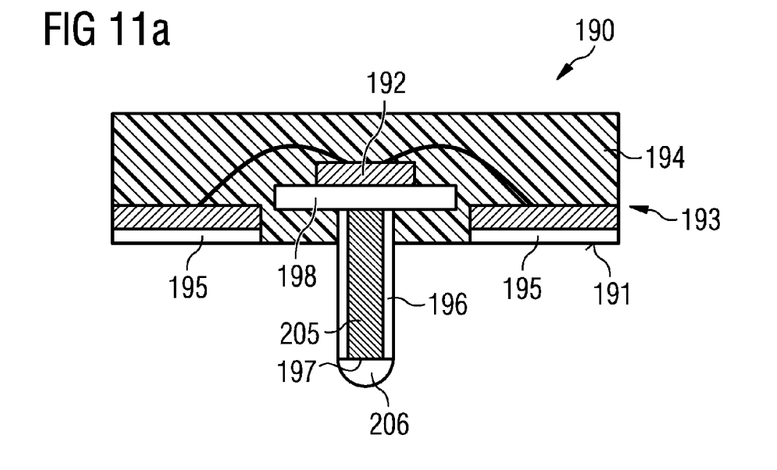
FIG. 11a illustrates a cross-sectional view of an electronic component.
Figure 11B:
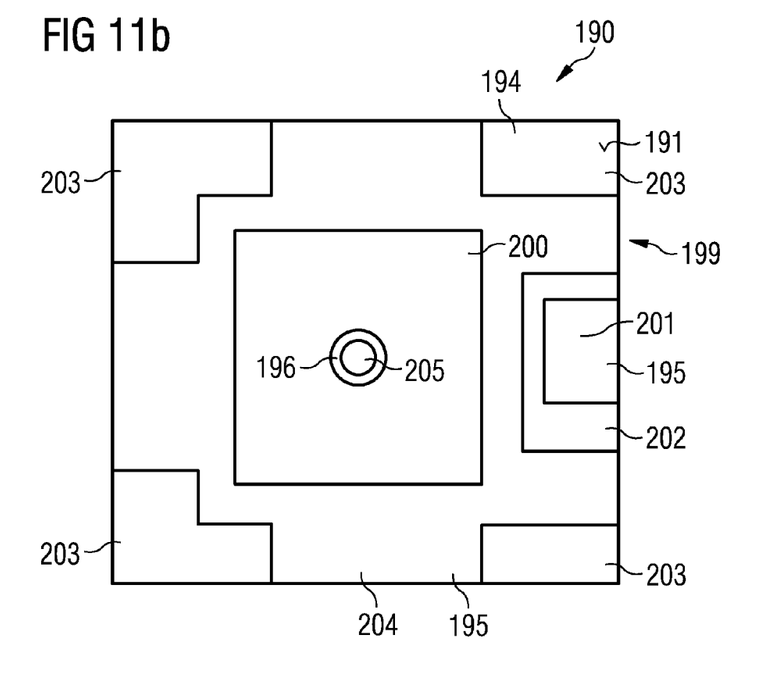

FIG. 11a illustrates a cross-sectional view of an electronic component 190 and FIG. 11b illustrates a plan view of the lower surface 191 of the electronic component 190. The electronic component 190 includes a semiconductor device 192, a leadframe 193 and a housing provided by epoxy resin 194. The leadframe 193 includes portions which are exposed from the epoxy resin 194 and which provide the outer contacts of the electronic component 190. As is illustrated in the cross-sectional view of FIG. 11a, the electronic component 190 includes outer contacts in the form of surface mountable lands 195 which lie in a common plane parallel with the lower surface 191 of the epoxy resin 194.

The electronic component 190 further includes a protruding portion 196 which provides an outer contact in the form of a pin 197. The pin 197 protrudes from a portion of the leadframe 193 and, in particular, protrudes from a lower surface of a die pad region 198 of the leadframe 193 on which the semiconductor device 192 is mounted.

The semiconductor device 192 may be a transistor with an electrode at its rear surface. The semiconductor device 192 is electrically connected to the die pad 198. The epoxy resin 194 covers the long surface of the pin 197 and a lower surface of the pin 197 is exposed and provides the high voltage contact 205 of the electronic component 190. The high voltage contact 205 is positioned in a different plane from the lands 195 which provide low voltage contact pads.

FIG. 11b illustrates the footprint 199 of the electronic component 190. The footprint 199 includes a central high voltage contact 205 provided by the protruding portion 196 and pin 197 which is surrounded by a portion 200 of the epoxy resin 194 of the housing of the electronic component 190. The footprint 199 further includes a contact pad 201 in the form of a land 195 which is also surrounded on three sides by a portion 202 of the epoxy resin forming the housing 194. Each of the four corners of the footprint 199 also includes epoxy resin 203 with the remaining regions of the lower surface 191 of the electronic component 190 being formed of a conductive material and providing the low voltage contact pad 204 in the form of a land 195. In this embodiment, the low voltage contact pad 204 has an irregular shape and occupies a majority of the lower surface 191 of the electronic component 190. The low voltage contact pad 204 extends to the peripheral edge of the footprint 199 on all four sides of the electronic component 190. In other embodiments, the low voltage pad extends to one, two or three peripheral edges only.

The electronic component 190 may also include a conductive bump 206 mounted on the exposed surface of the pin 197. The bump 206 may provide the high voltage contact 205.

Figure 12:
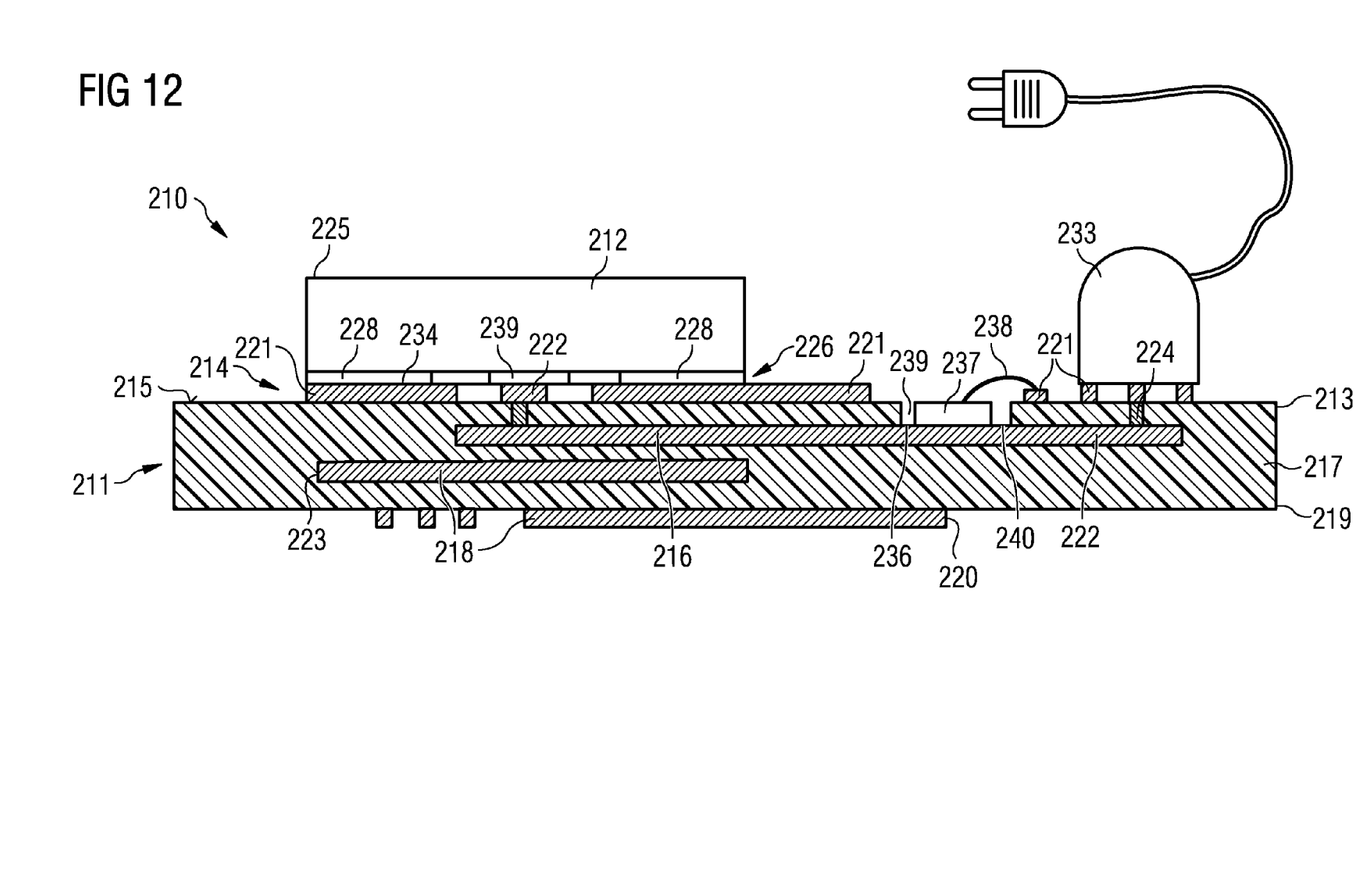
FIG. 12 illustrates a module.

FIG. 12 illustrates a module 210 according to an embodiment. The module 210 includes a redistribution board 211 and a high voltage semiconductor device 212.

The redistribution board 211 includes a first electrically non-conductive layer 213, a first electrically conductive layer 214 arranged on the upper surface 215 of the electrically non-conductive layer 213 and a second conductive layer 216 arranged on a lower surface of the non-conductive layer 213. The redistribution board 211 includes a second non-conductive layer 217 positioned on the lower surface of the second conductive layer 216, a third conductive layer 218 positioned on the lower surface of the second non-conductive layer 217, a third non-conductive layer 219 positioned on the third conductive layer 218 and fourth conductive layer 220 positioned on the lower surface of the third non-conductive layer 219. The conductive layers 214, 216, 218, 220 are interleaved by non-conductive layers 213, 217, 219 and provide a multilayer redistribution structure.

The first conductive layer 214 is positioned on the upper surface 215 of the redistribution board 211 and includes a plurality of electrically conductive traces 221 for low voltage signals. The second conductive layer 216 is positioned within the redistribution board 211 and spaced at a distance from the first conductive layer 214 by the first non-conductive layer 213. The second conductive layer 216 is configured to carry high voltage signals. The high voltage redistribution structure of the redistribution board 211 includes traces 222 within the second conductive layer 216 and at least two electrically conductive vias 223, 224 which extend from the upper surface 215 of the redistribution board 211 through non-conductive layer 213 to one or more traces 222 of the second conductive layer 216.

The conductive vias 223, 224 enable devices, such as the high voltage semiconductor device 212, which are mounted on the upper surface 215 of the redistribution board 211 to be electrically coupled to the second conductive layer 216 which is buried within the body of the redistribution board 211. The conductive vias 223, 224 are each surrounded by a conductive trace 221 of the first conductive layer 214.

Figure 13:
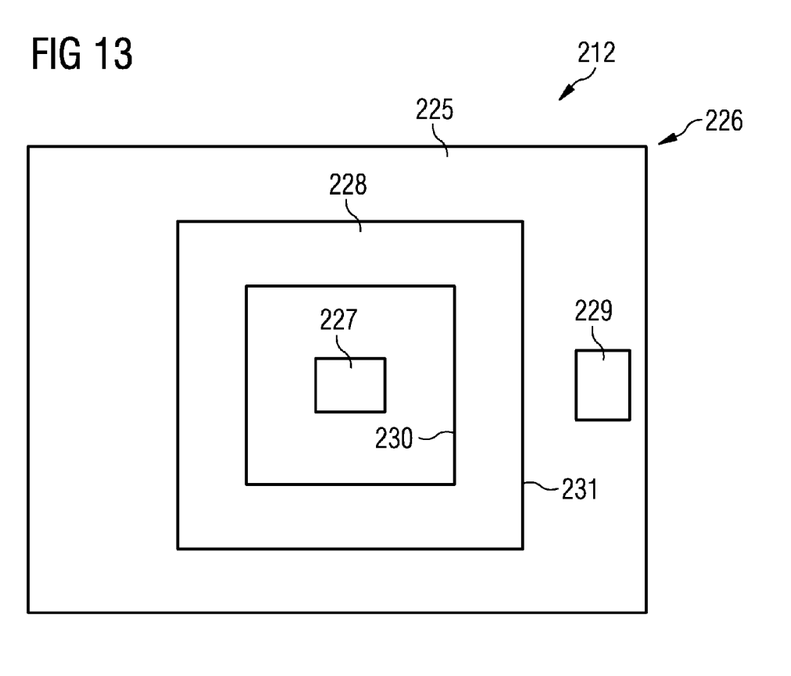
FIG. 13 illustrates a footprint of an electronic component mounted on the module of FIG. 12.

The high voltage electronic component 212 includes a package 225 enclosing a high voltage semiconductor device (out of view) and a package footprint 226. The package footprint 226 includes contact pads or lands which are surface-mountable on traces 221 of the first conductive layer 214. The high voltage electronic component 212 may be a Group III nitrite transistor such as a gallium nitride-based HEMT. A plan view of the footprint 226 of the electronic device 212 is illustrated in FIG. 13.

In this embodiment, the electronic component 212 includes a gallium nitride-based HEMT and has a drain contact pad 227, a source contact pad 228 and a gate contact pad 229. The drain contact pad 227 is a high voltage contact and is positioned centrally within the lateral area of the footprint 226. The drain contact pad 227 is surrounded on all four sides by a ring shaped source contact pad 228 which has an inner boundary 230 spaced at a distance d from the side face of the drain contact pad 227 and an outer boundary 231 spaced at a distance from the gate contact pad 229 which is positioned adjacent and spaced apart from the outer boundary 231 on one side of the footprint 226. The high voltage contact pad in the form of the drain contact pad 227 is arranged underneath the body of the electronic device 212 when this is mounted on the redistribution board as is illustrated in FIG. 12.

The first conductive layer 214 of the redistribution board 211 includes a high voltage contact pad 239 mounted on and electrically coupled to the conductive via 223. The high voltage contact pad 239 is surrounded on all four sides by a low voltage conductive trace 234 which is spaced at a distance from the high voltage contact pad 239. The arrangement of the high voltage contact pad 239 and the low voltage conductive trace 234 corresponds to that of the footprint 216 of the electronic component 212.

The drain contact pad 227 of the electronic component 212 is mounted on the high voltage contact pad 239. The ring-shaped source contact pad 228 of the electronic component 212 is mounted on a similarly sized and shaped conductive trace 234 which forms part of the first conductive layer 214. The gate pad 229 is mounted on a further conductive trace of the first conductive layer 214. The source contact pad 228 and the ring-shaped low voltage contact conductive trace 234 provide shielding for the centrally placed high voltage contact pad 239 and conductive via 223 and the high voltage redistribution structure of the redistribution board 211.

The body of the electronic component 212 itself acts as a cover against pollution, such as dust or other particles, dropping onto outer surfaces of the electronic component 212 and protects the high voltage contact pads, that is the drain contact pad 227 of the electronic component 212 and the high voltage contact pad 239 of the redistribution board 211, from coming into contact with this possible pollution. The via 223 extends to the rear side of the contact pad 232, which is positioned in the first conductive layer 214, and provides a high voltage signal carrying path from the drain contact pad 227 of the electronic component 212, over the conductive via 223, the conductive traces 222 of the second electrically conductive layer 216, and the second electrically conductive via 224 to an output 233 which may be connectable to a power supply, for example.

The redistribution board 211, for example the first non-conductive layer 213 may include a recess or cavity 235 exposing a portion 236 of the second conductive layer 216 in the base 240 of the recess 235. This arrangement may be used to mount a device 237, such as a diode, directly on the exposed portion 236 of the second conductive layer 216 which provides the redistribution structure for high voltage signals. The device 237 may also be electrically coupled to a low voltage trace 221 by a conductive member 238 such as a bond wire of contact clip.

Figure 14A:
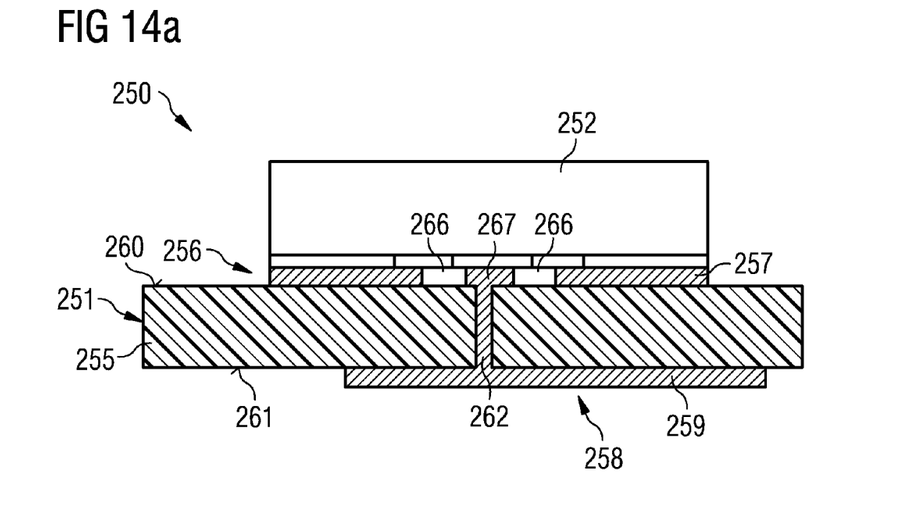
FIG. 14a illustrates a cross-sectional view of a module.
Figure 14B:
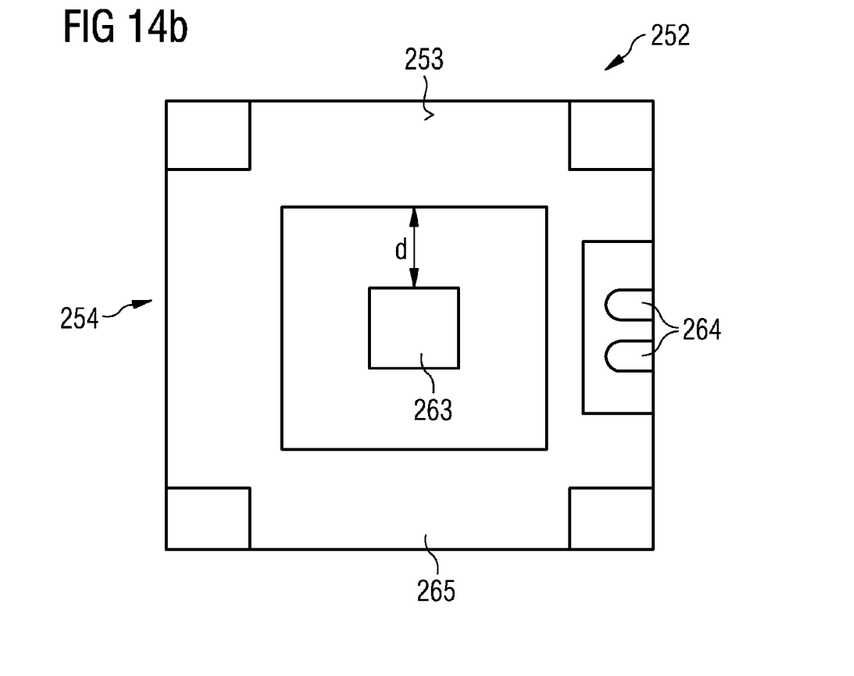
Figure 15A:
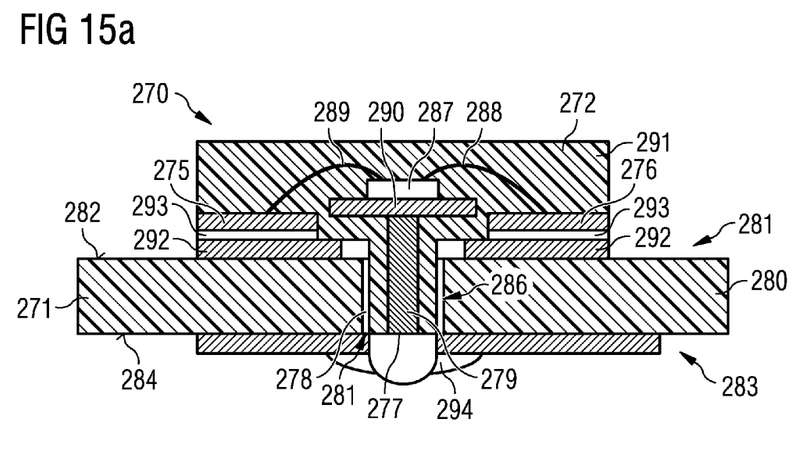
FIG. 15a illustrates a cross-sectional view of a module.
Figure 15B:
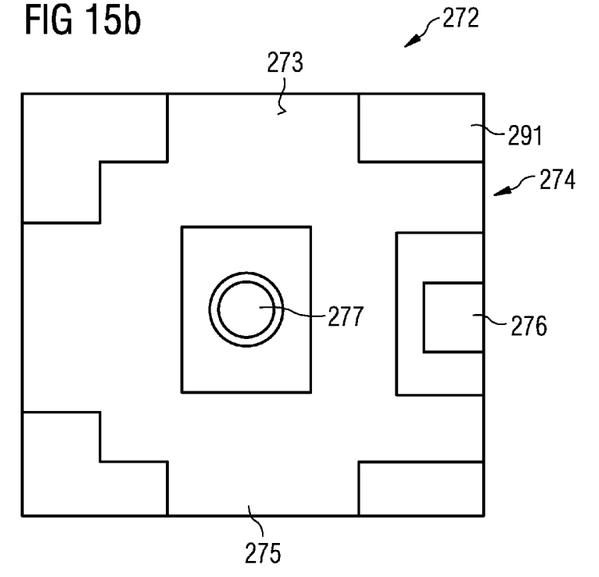

FIGS. 14 and 15 illustrate further modules including a redistribution board and at least one electronic component.

FIG. 14a illustrates a cross-sectional view of a module 250 including a redistribution board 251 and an electronic component 252. FIG. 14b illustrates a plan view of a lower surface 253 of the electronic component 252 and illustrates the footprint 254 of the electronic component 252.

The redistribution board 251 includes a non-conductive layer 255, a first conductive layer 256 providing a redistribution structure 257 for low voltage signals and a second conductive layer 258 providing a redistribution structure 259 for high voltage signals. The first conductive layer 256 is arranged on an upper surface 260 of the non-conductive layer 255 and the second conductive layer 258 is arranged on the opposing lower surface 261 of the non-conductive layer 255. The redistribution board 251 further includes a conductive via 262 which extends through the thickness of the non-conductive layer 255 from the upper surface 260 to the lower surface 261 and is electrically connected to the second conductive layer 258. The first conductive layer 256 includes a contact pad 267 which covers and is electrically connected to the conductive via 262 and forms a portion of the redistribution structure 259 for high voltage signals.

As is illustrated in the plan view of FIG. 14b, the electronic component 252 includes a single high voltage contact land 263 arranged in the centre of the lower surface 253 and two signal contact pads 264 arranged at the periphery of one side of the footprint 254. The electronic component 252 further includes a low voltage contact pad 265 which covers the lower surface 253 the apart from the four corners and the regions surrounding the high voltage contact land 263 and signal contact pads 264. The electronic component 252 includes contact lands as outer contacts which are arranged in a common plane. The first conductive layer 256 includes a plurality of traces 257 providing a redistribution structure which corresponds to the footprint 254 of the electronic component 252.

The low voltage contact pad 265 and the signal contact pads 264 of the electronic component 252 are mounted on the traces 257 providing the redistribution structure for low signals by solder connections. The high voltage contact land 263 of the electronic component is mounted on the contact pad 267 by a solder connection. The contact pad 267 is coupled to the high voltage redistribution structure 259 on the opposing surface of the redistribution board 251 by the conductive via 262.

The conductive traces 257 of the redistribution structure for low voltage signals have a lateral arrangement corresponding to the footprint 254 of the electronic component 252. One of these traces 257 surrounds the high voltage contact pad 267 and the high voltage contact land 263 of the electronic component 252 and may be used to provide shielding. The creepage distance is indicated in FIG. 14b with the reference number 266. The high voltage contact land 263, corresponding contact pad 267 and the conductive via 262 are covered by the electronic component 252 since they are positioned towards the lateral centre of the footprint 254 of the electronic component 252. The electronic component 252 provides protection for the high voltage contact land 263 and exposed portion of the high voltage redistribution structure, i.e. the contact pad 267 positioned on the upper surface of the redistribution board 251, from environmental pollution.

FIG. 15a illustrates a cross-sectional view of a module 270 including a redistribution board 271 and an electronic component 272. FIG. 15b illustrates a plan view of a lower surface 273 of the electronic component 272 illustrates the footprint 274 of the electronic component 272.

The footprint 274 corresponds to the footprint illustrated in FIG. 11b and the electronic component corresponds to the electronic component illustrated in FIG. 11a.

The electronic component 272 includes two types of outer contacts. The low voltage contact pads 275 and 276 are provided by lands and the high voltage contact 277 is provided by a protruding region 278 and a conductive pin 279.

The high voltage contact 277 is positioned in a different plane from the low voltage contact pads 275, 276. This arrangement may be used to increase the creepage distance, since the creepage distance includes the length of the pin 279.

The redistribution board 271 includes a non-conductive layer 280, a first conductive layer 281 providing a redistribution structure for low voltage signals positioned on an upper surface 282 of the non-conductive layer 280 and a second conductive layer 283 providing a redistribution structure for high voltage signals positioned on an opposing lower surface 284 of the non-conductive layer 280. The redistribution board 271 further includes a through-hole 295 for accommodating the protruding region 278 of the electronic component 272.

The electronic component 272 is mounted on the upper side 282 of the redistribution board 271 such that the low voltage contact pads 275, 276 are mounted on traces of the first conductive layer 281 and such that the protruding portion 278 is positioned within the through-hole 281 and extends to the opposing lower surface 284 of the non-conductive layer 280. The contact pin 279 is electrically connected with the second conductive layer 283 by a solder deposit 294 which extends between the pin 279 and the second conductive layer 283. In this embodiment, the creepage distance is the thickness of the non-conductive layer 280 is illustrated in FIG. 15a by the reference number 286.

The semiconductor device 287 of the electronic component 272 may be a high voltage driven transistor device, for example a Group III nitride transistor device. In this embodiment, the semiconductor device 287 includes a gate electrode which is electrically conducting coupled to gate contact 276 by a bond wire 288 and a source electrode which is electrically connected to a source contact 275 by bond wire 289. The semiconductor device 287 further includes a drain electrode which is electrically coupled to the die pad 290 positioned within the housing 291 of the electronic component 272 and pin 279.

The contacts 275, 276 are provided by the lower surface of portions of a leadframe including the die pad 290. The surface mountable contacts 275, 276 are mounted on traces 292 of the first conductive layer 281 by solder connections 293.

In some embodiments, the high voltage contact pad is positioned in the lateral centre of the lower surface of the electronic component. When electronic component is mounted on a redistribution board, the high voltage contact is positioned underneath the electronic component and is protected by the surrounding peripheral regions of the electronic component. Consequently, the electronic component itself provides physical protection from pollution, such as dust, falling on the upper side of the electronic component so that it fails to come into contact with the high voltage contact pad positioned in the lateral centre.

The creepage distance may be increased by use of the physically separate redistribution structures for the low voltage signals and the high voltage signals. In particular, the redistribution structure for low voltage signals is arranged on an opposing surface of a non-conductive layer to that of the redistribution structure for high voltage signals. Since the electronic component is mounted on one side of the redistribution board, a conductive vertical connection is provided which extends from one side to the other side of the redistribution board to enable the electronic component to be electrically coupled to the redistribution structure on the opposing surface. In some embodiments, one or more conductive vias are provided in the redistribution board. In other embodiments, the electronic component includes a protruding region providing a pin type structure and the redistribution board includes a non-conductive through-hole shaped to accommodate the protruding portion of the electronic component.

Spatially relative terms such as "under", "below", "lower", "over", "upper" and the like are used for ease of description to explain the positioning of one element relative to a second element. These terms are intended to encompass different orientations of the device in addition to different orientations than those depicted in the Figs.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A redistribution board, comprising:
   a first conductive layer comprising a redistribution structure for low voltage signals;
   a second conductive layer comprising a redistribution structure for high voltage signals;
   a non-conductive layer, the second conductive layer being spaced apart from the first conductive layer by the non-conductive layer; and
   a conductive connector extending from a mounting surface of the redistribution board to the second conductive layer, the conductive connector being surrounded by a low voltage trace of the first conductive layer.

2. The redistribution board of claim 1, wherein the low voltage trace is a continuous ring.

3. The redistribution board of claim 1, wherein the first conductive layer is positioned on the mounting surface of the redistribution board.

4. The redistribution board of claim 1, wherein the second conductive layer is positioned on a second surface of the non-conductive layer, the second surface opposing the mounting surface.

5. The redistribution board of claim 1, further comprising an additional non-conductive layer, the second conductive layer being positioned between the non-conductive layers.

6. The redistribution board of claim 1, further comprising a second electrically conductive connector extending from the second conductive layer to a surface of the non-conductive layer and being surrounded by a second low voltage trace positioned on the surface.

7. An electronic component, comprising:
   at least one high voltage driven semiconductor device; and
   a footprint comprising a high voltage contact and a low voltage contact pad surrounding, and spaced apart from, the high voltage contact.

8. The electronic component of claim 7, wherein the low voltage contact pad has a continuous ring form.

9. The electronic component of claim 7, wherein the low voltage contact pad is electrically insulated from the high voltage contact.

10. The electronic component of claim 7, further comprising a control contact pad spaced at a distance from an outer boundary of the low voltage contact pad.

11. The electronic component of claim 7, further comprising a plurality of signal pads spaced at a distance from an outer boundary of the low voltage contact pad.

12. The electronic component of claim 7, further comprising at least one further high voltage contact, the high voltage contact and the at least one further high voltage contact being surrounded by the low voltage contact pad.

13. The electronic component of claim 7, further comprising a signal contact pad spaced at a first distance on least three sides from the low voltage contact pad, wherein the high voltage contact is spaced a second distance on all sides from the low voltage contact pad.

14. The electronic component of claim 7, further comprising a housing, wherein the low voltage contact pad is provided by a land and the high voltage contact is provided by one of a pin protruding from the housing and a land.

15. The electronic component of claim 7, wherein the high voltage driven semiconductor device is a transistor having a drain electrode, a source electrode and a gate electrode, the drain electrode being electrically coupled to the high voltage contact and the source electrode being electrically coupled to the low voltage contact pad.

16. The electronic component of claim 7, wherein the high voltage driven semiconductor device is a Group III-nitride HEMT.

17. A module comprising a redistribution board and an electronic component, the redistribution board comprising:
   a first conductive layer comprising a redistribution structure for low voltage signals;
   a second conductive layer comprising a redistribution structure for high voltage signals;

a non-conductive layer, the second conductive layer being spaced apart from the first conductive layer by the non-conductive layer; and a conductive connector extending from a mounting surface of the redistribution board to the second conductive layer, the conductive connector being surrounded by a low voltage trace of the first conductive layer, wherein the electronic component comprises at least one high voltage driven semiconductor device and a footprint, the footprint comprising a high voltage contact electrically coupled to the second conductive layer and a low voltage contact pad surrounding, and spaced apart from, the high voltage contact and electrically coupled to the low voltage trace.

18. The module of claim 17, wherein the conductive connector is provided by a conductive via positioned in the non-conductive layer and the high voltage contact of the electronic component is mounted on the conductive via.

19. The module of claim 17, wherein the high voltage contact of the electronic component comprises a protruding pin providing the conductive connector.

20. The module of claim 17, wherein the electronic component covers the conductive connector and the low voltage trace.

\* \* \* \* \*

UNITED STATES PATENT AND TRADEMARK OFFICE
CERTIFICATE OF CORRECTION

PATENT NO. : 8,975,735 B2  
APPLICATION NO. : 13/962622  
DATED : March 10, 2015  
INVENTOR(S) : R. Otremba et al.

Page 1 of 1

It is certified that error appears in the above-identified patent and that said Letters Patent is hereby corrected as shown below:

In the Claims

Column 14, line 45 (claim 13, line 2) please change "on least" to -- on at least --

Signed and Sealed this
Eighteenth Day of August, 2015

Michelle K. Lee
*Director of the United States Patent and Trademark Office*